United States Patent
Yen et al.

(10) Patent No.: US 9,449,888 B2
(45) Date of Patent: Sep. 20, 2016

(54) INTEGRATED CIRCUIT STRUCTURE TO RESOLVE DEEP-WELL PLASMA CHARGING PROBLEM AND METHOD OF FORMING THE SAME

(71) Applicant: TAIWAN SEMICONDUCTOR MANUFACTURING COMPANY, LTD., Hsinchu (TW)

(72) Inventors: David Yen, Chu-Bak (TW); Sung-Chieh Lin, Zhubei (TW); Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/594,259

(22) Filed: Jan. 12, 2015

(65) Prior Publication Data
US 2015/0140748 A1 May 21, 2015

Related U.S. Application Data (62) Division of application No. 13/433,194, filed on Mar. 28, 2012, now Pat. No. 8,946,825.

(51) Int. Cl.
| | |
|---|---|
| H01L 21/8238 | (2006.01) |
| H01L 27/092 | (2006.01) |
| H01L 21/263 | (2006.01) |
| H01L 29/66 | (2006.01) |
| H01L 27/06 | (2006.01) |

(52) U.S. Cl.
CPC ..... *H01L 21/823892* (2013.01); *H01L 21/263* (2013.01); *H01L 21/823871* (2013.01); *H01L 21/823878* (2013.01); *H01L 27/0928* (2013.01); *H01L 29/6609* (2013.01); *H01L 27/0629* (2013.01)

(58) Field of Classification Search
CPC .............................................. H01L 21/823892
See application file for complete search history.

(56) References Cited

U.S. PATENT DOCUMENTS

| | | | | |
|---|---|---|---|---|
| 3,562,547 | A | * | 2/1971 | Brode et al. ............ 361/1 |
| 5,416,351 | A | | 5/1995 | Ito et al. |
| 6,209,123 | B1 | | 3/2001 | Maziasz et al. |
| 2008/0144242 | A1 | * | 6/2008 | Lai ............ H01L 27/0262 361/56 |
| 2009/0315119 | A1 | | 12/2009 | Stribley et al. |
| 2010/0133589 | A1 | | 6/2010 | Aruga et al. |
| 2012/0175708 | A1 | | 7/2012 | Schuetz et al. |
| 2012/0300349 | A1 | | 11/2012 | Abou-Khalil et al. |

* cited by examiner

*Primary Examiner* — Peniel M Gumedzoe
*Assistant Examiner* — Christopher Johnson
(74) *Attorney, Agent, or Firm* — Hauptman Ham, LLP (57) ABSTRACT

A method for forming an integrated circuit includes forming a deep n-well (DNW) in a substrate, and forming a PMOS transistor in the DNW. The method also includes forming an NMOS transistor in the substrate and outside the DNW, and forming a reverse-biased diode. The method further includes forming an electrical path between a drain of the PMOS transistor and a gate structure of the NMOS transistor. The dissipation device is also connected to the electrical path.

19 Claims, 7 Drawing Sheets

INTEGRATED CIRCUIT STRUCTURE TO RESOLVE DEEP-WELL PLASMA CHARGING PROBLEM AND METHOD OF FORMING THE SAME

PRIORITY CLAIM

The present application is a divisional of U.S. application Ser. No. 13/433,194, filed Mar. 28, 2012, which is incorporated herein by reference in its entirety.

RELATED APPLICATION

This application relates to the following co-pending and commonly assigned patent application Ser. No. 13/246,495, filed Sep. 27, 2011, which is incorporated herein in its entirety.

BACKGROUND

Integrated circuits (ICs) have become increasingly important. Applications, such as cell phones, smart phones, tablets, laptops, notebook computers, PDAs, wireless email terminals, MP3 audio and video players, portable wireless web browsers and the like, using ICs are used by millions of people. Integrated circuits increasingly include powerful and efficient on-board data storage and logic circuitry for signal control and processing.

An increased density of devices in integrated circuits and a combination of various types of circuitry, such as logic and radio frequency processing circuits, have generally increased the amount of noise in various circuits. Noise can be detrimental in integrated circuits because an integrity of a signal can be compromised, which can in turn cause a loss of data or errors in logic or signal processing.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments are generally described in the context of an integrated circuit. Embodiments may be applied to any integrated circuit, for example, a logic circuit, a static random access memory (SRAM), and the like.

During device manufacturing, various plasma processes may be used in fabricating devices and interconnects for connecting these devices. Plasma processes used in manufacturing devices may include, but are not limited to, reactive ion etch (RIE) used for removing materials on a semiconductor substrate, plasma-enhanced deposition for forming films, ion implantation for forming doped regions, and physical vapor deposition (PVD) for depositing conductive materials, etc. For example, a high density plasma (HDP) deposition may be used to deposit an inter-level dielectric (ILD) layer, or inter-metal dielectric (IMD) layer. Physical vapor deposition (PVD) that uses plasma discharge to sputter conductive materials off targets for depositing them on substrates to form, contacts, and vias in the ILD layers. Plasma ions may directly contact a substrate surface and be implanted into the substrate. In addition, plasma ions may be transferred to a substrate indirectly. For example, plasma may be used to assist etching, such as in the case of reactive ion etch (RIE), to form openings or patterns in or on substrates. The openings generally extend to some underlying conductive feature, and the plasma used for the plasma process is able to contact the conductive feature and be transported into the substrate. In structures having devices having doped wells, charges from the plasma can be transferred through the conductive feature to the doped wells.

Figure 1A:
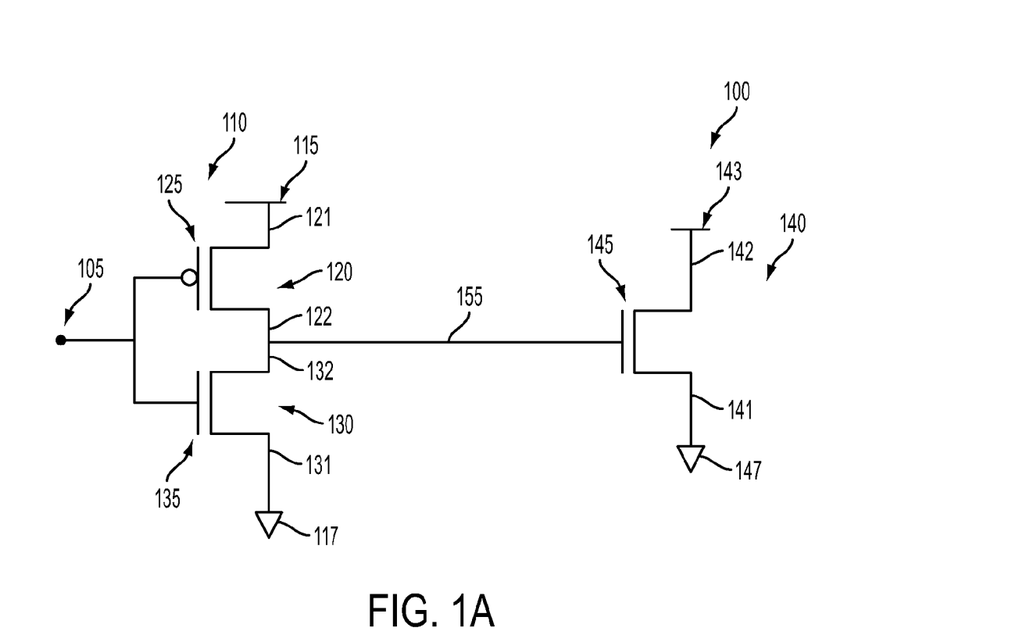
FIG. 1A is a circuit diagram of an inverter and an n-channel metal-oxide-semiconductor field-effect transistor (NMOSFET) transistor, in accordance with some embodiments.

FIG. 1A is a circuit diagram 100 of an inverter 110 used to control an n-channel metal-oxide-semiconductor field-effect transistor (MOSFET) transistor 140, in accordance with some embodiments. An N-channel MOSFET may also be called an NMOS transistor. The inverter 110 is made of a p-channel MOSFET transistor (or PMOS transistor) 120 and an NMOS transistor 130. The PMOS transistor 120 has a source 121, a drain 122, and a gate 125. The source 121 is connected to a positive power supply (e.g., VDD) 115 and the drain 122 is connected to a drain 132 of NMOS transistor 130. The NMOS transistor 130 has a source 131, the drain 132, and a gate 135. The source 131 of the NMOS transistor 130 is connected to a ground 117. The gate 125 of PMOS transistor 120 and the gate 135 of NMOS transistor 130 are connected to a signal source 105. NMOS transistor 140 has a source 141, a drain 142, and a gate 145. The source 141 of NMOS transistor 140 is connected to a ground 147. The drain 142 of NMOS 140 is connected to a power source 143. The gate 145 of NMOS transistor 140 is connected to the drain 122 of PMOS transistor 120 and the drain 132 of NMOS transistor 130 via a signal line 155.

Figure 1B:
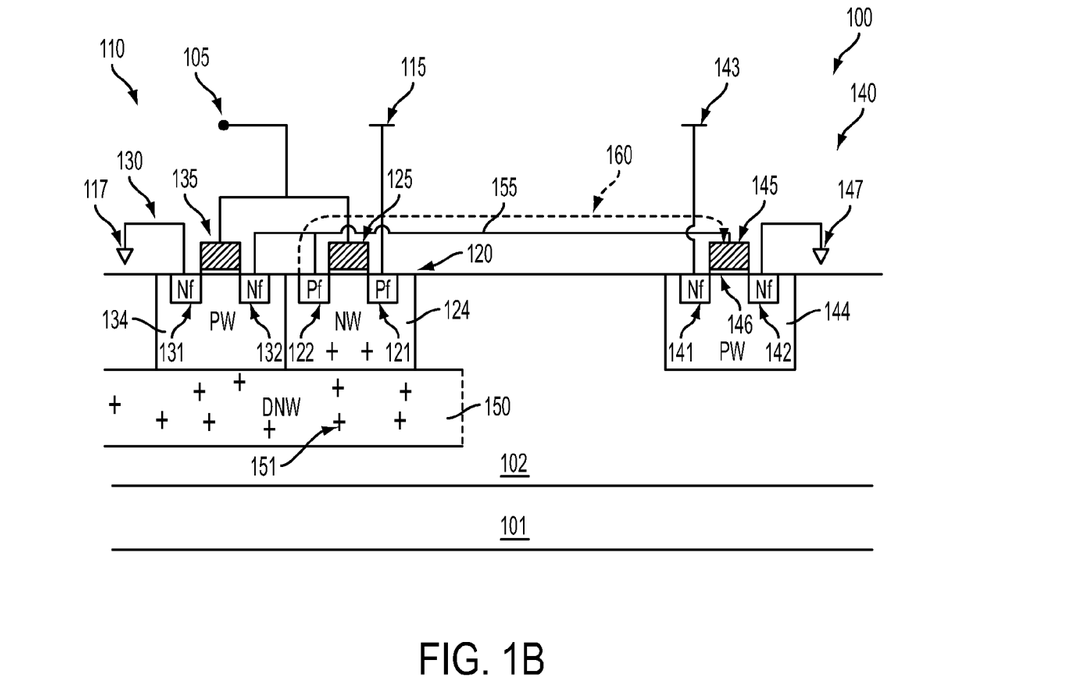
FIG. 1B is a cross-sectional view of a device portion of the inverter and an n-channel metal-oxide-semiconductor (NMOS) transistor, in accordance with some embodiments.

FIG. 1B is a cross-sectional view of a device portion of an inverter (e.g., inverter 110) and an NMOS transistor (e.g., NMOS transistor 140), in accordance with some embodiments. The inverter 110 and NMOS transistor 140 are formed in and on a substrate 101 within a p-doped region 102. In some embodiments, additional layer(s) are between the p-doped region 102 and substrate 101.

The source 141 and drain 142 (both are doped with n-type dopants) of NMOS transistor 140 are formed in a p-well (or PW) 144. The source 121 and drain 122 (both are doped with p-type dopants) of PMOS transistor 120 of inverter 110 are formed in an n-well (or NW) 124. The source 131 and drain 132 (both are doped with n-type dopants) of NMOS 130 are formed in a p-well (or PW) 134. Both the n-well 124 and p-well 134 of inverter 110 are formed over a deep n-well (or DNW) 150.

As mentioned above, noise can be detrimental in integrated circuits because an integrity of a signal can be compromised. Devices in an integrated circuit are formed in a deep doped well, such as DNW 150 described above, to isolate substrate noise. Deep doped wells refer to doped wells that are located lower (or deeper into substrate) than the doped wells surrounding transistors and/or other devices. The deep doped well (e.g., DNW 150) is typically able to reduce noise between other devices in the substrate and devices in the deep doped well by providing a low resistance path for the noise to travel to a ground node rather than affect devices in the deep doped well. For example, devices for high speed applications, having mixed signals, or having radio frequency (RF) circuits are susceptible to noise interference. Therefore, such devices may employ the deep doped well (e.g., DNW 150) for noise reduction.

As mentioned above, many manufacturing processes involve plasma. If substrate 101 is not grounded properly, ions in the plasma could accumulate in various layers in and/or on substrate 101. For example, during RIE, the substrate 101 is biased to attract positive etching ions to increase ion energy and etch rate. Improper substrate grounding accumulates positive ions in or on substrate 101, such as positive ions 151 in the DNW 150. DNW 150 is a relatively large region in comparison to NW 124, PW 134 and NW 144. As a result, charges accumulated in DNW 150 could be fairly significant. The charges collected in DNW 150 could be a result of one or more plasma processing operations, such as etching, film deposition, and ion implant, etc.

When signal line 155 (an interconnect) between the gate 145 of NMOS transistor 140 and the drain 122 of PMOS transistor 120 is formed, the positive ions 151 could flow from drain 122 to gate structure 145 due to a voltage drop and could damage a gate dielectric 146 in the gate 145. Dotted line 160 indicates a flow of positive ions 151. Damaged gate dielectric 146 would make a performance of NMOS transistor 140 inconsistent and uncontrollable. Therefore, the charges in the DNW 150 would degrade a yield of transistor 140.

The signal line 155 can be formed on one single metal layer, such as M1 (first metal layer), M2, or other metal layer, in accordance with some embodiments. Alternatively, the signal line 155 may be formed on more than one metal layer having vias connecting the metal layers. For example, the signal line 155 may involve metal layers M1, M2, and M3 and have vias V1 (first via layer) and V2 connecting M1 to M2, and M2 to M3, respectively. The positive ions (plasma charge) 151 in DNW 150 flow from drain 122 toward gate structure 145 if the final metal layer, such as M3 layer in the previous example, of signal line 155 is deposited. As mentioned above, the gate dielectric 146 could be damaged by the positive ions 151.

The plasma damage caused by the accumulated positive ions 151 in the DNW 150 is different from the plasma damage involving an antenna (conductive structures connected to the damaged gate). Antenna plasma damage involves conductive layers connected to gate structures and is affected by a size of the antenna. Positive ions 151 flow from the gate dielectric through the conductive layer(s) and the conductive layer(s) acts as the antenna to collect the positive ions 151. Antenna plasma damage mainly results from backend processing, which involves backend plasma processes, such as deposition and etching of dielectric and metal layers.

Antenna plasma damage can be measured by an antenna ratio, which is a surface area of a conductive layer to a surface area of a gate structure. As long as the antenna ratio is lower than a certain limit, which depends on the plasma process(es) involved, the plasma antenna damage to the gate dielectric is insignificant and device performance is not affected. An antenna design rule can be used to make sure a circuit design does not violate the antenna ratio. However, plasma damage by positive ions 151 in DNW 150 is different from antenna plasma damage. Positive ions 151 in DNW 150 come from exposure of the DNW 150 region to plasma sources during manufacturing. The plasma sources can come from frontend plasma process(es) and backend plasma process(es). Examples of frontend processing include, but are not limited to, film deposition, etching, and implantation, etc. Studies show that antenna design rules cannot resolve plasma damage caused by positive ions 151 in DNW 150. Devices, such as NMOS transistor 140, can pass the antenna design rule but still suffer from damage caused by positive ions 151 from DNW 150. Antenna design rules evaluate various antenna ratios of metal layers to gate structures and are used to check plasma damage from backend processing. Antenna design rules do not account for sources of plasma damage before forming M1, including frontend processing.

Figure 2A:
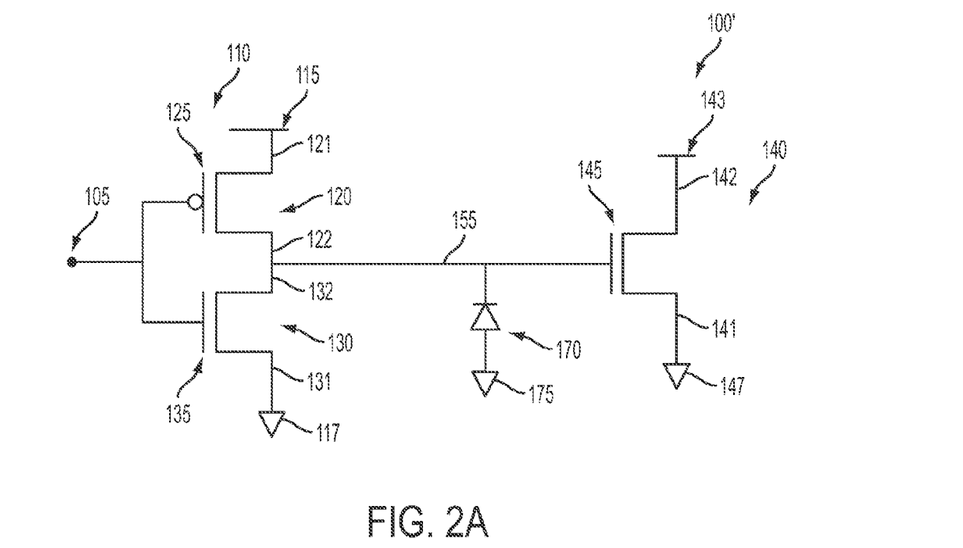
FIG. 2A is a circuit diagram of an inverter and an NMOS transistor connected to an n-type diode, in accordance with some embodiments.

FIG. 2A is a circuit diagram 100' similar to circuit diagram 100 having an addition of a diode (a charge dissipation device) 170, in accordance with some embodiments. Diode 170 is placed between the inverter 110 (or PMOS transistor 120) and the NMOS transistor 140. In some embodiments, diode 170 is a reverse-biased protection diode. Diode 170 is used to drain the positive ions 151 from DNW 150. Diode 170 is also connected to signal line 155 and drains the charge flowing toward gate dielectric 146 of NMOS transistor 140. Diode 170 is grounded through ground 175. A breakdown voltage of diode 170 is lower than a breakdown voltage or Fowler-Norheim (FN) tunneling voltage of gate dielectric 146. Due to the lower breakdown voltage of diode 170, the gate dielectric 146 is protected. Since diode 170 is used to discharge positive ions 151 flowing towards the gate dielectric 146 of transistor 140, instead of discharging all the charges in the DNW 150, diode 170 does not need to be large. For example, the area of diode 170 may be about 0.68·m by 0.8·m.

Figure 2B:
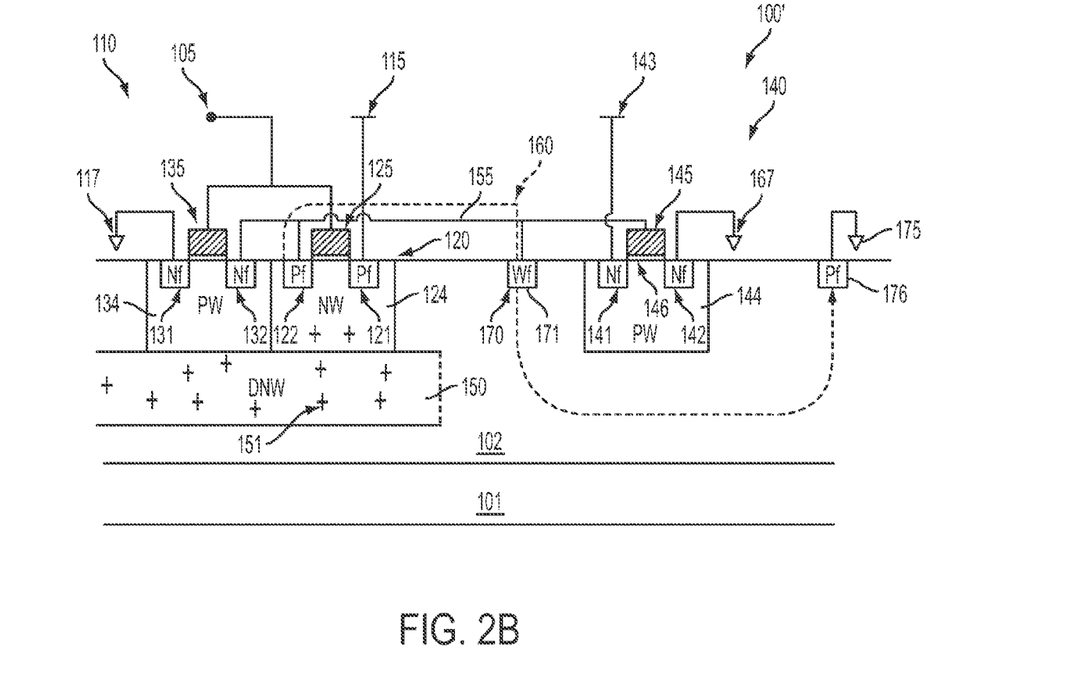
FIG. 2B is a cross-sectional view of a device portion of an inverter, a NMOS transistor, and a diode, in accordance with some embodiments.

FIG. 2B is a cross-sectional view of device structures of inverter 110, NMOS transistor 140 and diode 170, in accordance with some embodiments. Diode 170 includes an n-doped region 171, which is formed in the p-doped region 102, in accordance with some embodiments. The positive ions 151 from DNW 150 flowing from drain 122 flow through diode 170 before reaching gate dielectric 146. The positive ions 151 can be discharged to substrate pickups, which are designed to be present in many locations in the substrate 101. In some embodiments, the signal line 155 is at the M1 level. In some embodiments, a highest metal level of the signal line 155 is M3 (or third metal level). However, signal line 155 can be at any metal level or combination of metal levels.

Then-doped region 171 of diode 170 is formed in p-doped region 102 of substrate 101. However diode 170 may also be formed in PW 144 of transistor 140, as long as the positive ions 151 from DNW 150 are received by diode 170 (or more precisely n-doped region 171) prior to contacting gate dielectric 146 of gate structure 145. A flow 160' of positive ions 151 goes through diode 170 and is discharged through a substrate pickup 176, which is connected to a ground 175.

Figure 2C:
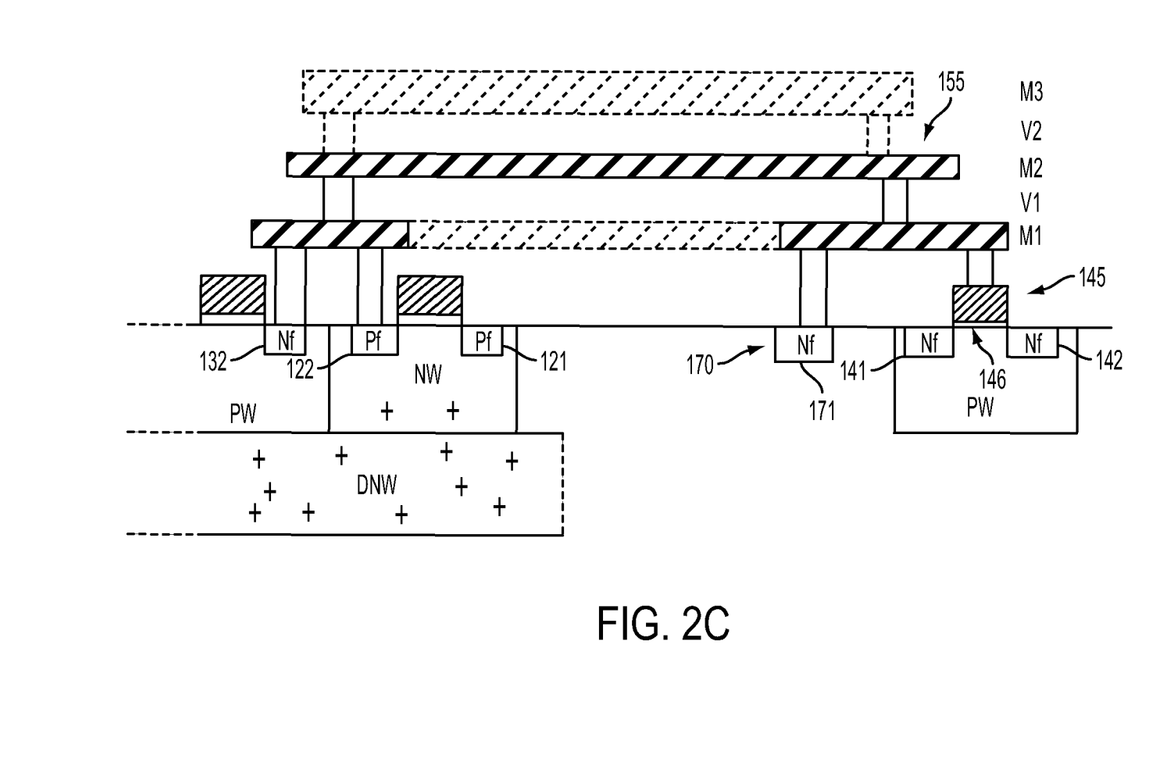
FIG. 2C is a cross-sectional view of a portion of a device and interconnect structures, in accordance with some embodiments.

FIG. 2C is a cross-sectional view of a portion of a device and interconnect structures, in accordance with some embodiments. In the embodiments shown in FIG. 2C, drain 122 of PMOS transistor 120 and drain 132 of NMOS transistor 130 are connected at a M1 connection 201. Similarly, diode 170 and the gate structure 145 of transistor 140 are connected at a M1 connection 202. The signal line 155 between the drains 122 and 132, and diode 170 and gate structure 145 can be at any metal level or combination of metal levels. For example, the signal line 155 can be at M1 level, M2 level, such as M2 connection 205, M3, or other higher metal level. The embodiments shown in FIG. 2C are merely examples, other configurations of interconnection between diode 170, gate structure 145, and signal line 155 are also possible. In some embodiments, the drain 122 should only be connected to gate structure 145 by either connecting to diode 170 at the same metal level or at a metal level higher than the level gate structure 145 is connected to diode 170.

In the examples described in FIGS. 1A, 1B, 2A, 2B and 2C, the device built on DNW 150 is an inverter. However, other devices, such as a transmission gate, may also be built on DNW 150. The plasma charging issue of DNW 150 and using diode 170 to protect a transistor from possible damage by the positive ions 151 in the DNW apply to any PMOS transistor built over a DNW having a drain connected a gate of an NMOS transistor not built on a DNW.

In the example described above, the positive ions 151 stored in the DNW 150 flows to a NMOS transistor not on DNW 150 connected to signal line 155 to discharge. Alternatively, the positive ions 151 in DNW 150 can attract electrons, which also could damage the gate dielectric layer 146.

Figure 3A:
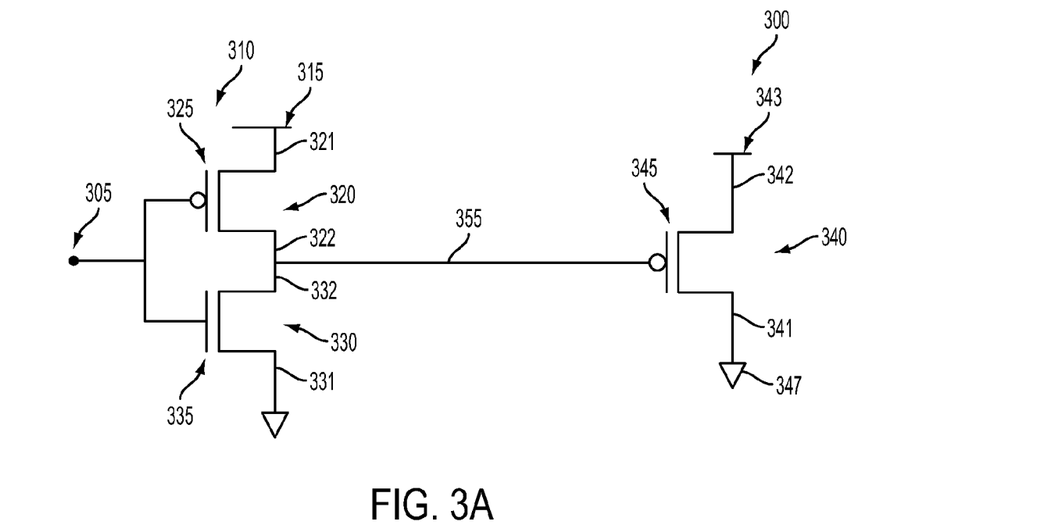
FIG. 3A is a circuit diagram of an inverter and a p-channel metal-oxide-semiconductor (PMOS) transistor, in accordance with some embodiments.

FIG. 3A is a circuit diagram 300 of an inverter 310 used to control a PMOS transistor 340, in accordance with some embodiments. The inverter 310 includes a PMOS transistor 320 and a NMOS transistor 330. The PMOS transistor 320 has a source 321, a drain 322, and a gate 325. The source 321 is connected to a power source 315 and the drain 322 is connected to a drain 332 of NMOS transistor 330. The NMOS transistor 330 has a source 331, the drain 332, and a gate 335. The source of the NMOS transistor 330 is connected to a ground 317. The gate 325 of PMOS transistor 320 and the gate 335 of NMOS transistor 330 are connected to a signal source 305. PMOS 340 has a drain 341, a source 342, and a gate 345. The drain 341 of PMOS transistor 340 is connected to a ground 347. The source 342 of PMOS 340 is connected to a power source 343. The gate 345 of PMOS transistor 340 is connected to the drain 322 of PMOS transistor 320 and the drain 332 of NMOS transistor 330.

Figure 3B:
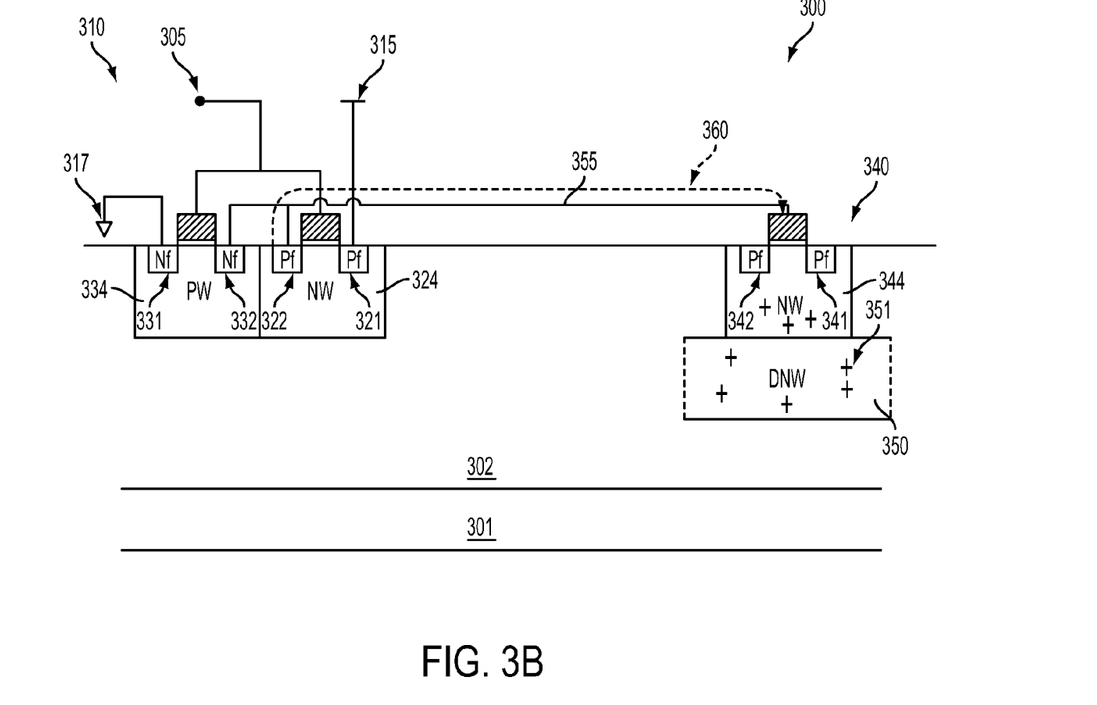
FIG. 3B is a cross-sectional view of a device portion of an inverter and a PMOS transistor, in accordance with some embodiments.

FIG. 3B is a cross-sectional view of the inverter 310 and PMOS transistor 340, in accordance with some embodiments. The inverter 310 and PMOS transistor 340 are formed on a substrate 301 within a p-doped region 302. In some embodiments, additional layer(s) are between the p-doped region 302 and substrate 301.

The source 342 and drain 341 (both are doped with p-type dopants) of PMOS 340 are formed in an n-well (or NW) 344, which is formed in a DNW region 350. In some embodiments, a portion (an upper portion) of a DNW region 350 encircles a lower portion of NW 344. The source 321 and drain 322 (both are doped with p-type dopants) of PMOS transistor 320 of inverter 310 are formed in an n-well (or NW) 324. The source 331 and drain 332 (both are doped with n-type dopants) of NMOS 330 are formed in a p-well (or PW) 334.

Positive ions 351 are accumulated in DNW 350. Potential sources of positive ions 351 are described above. If signal line 355 (an interconnect) between the gate 345 of PMOS transistor 340 and the drain 332 of NMOS transistor 130 is formed, the positive ions 351 could attract negative charges from source 331, which flow toward a gate dielectric 346 of gate 345. The electrons flowing through the gate dielectric 346 could create an electric field and damage gate dielectric 346. As mentioned above, damage to gate dielectric 346 would make the performance of transistor 340 inconsistent and uncontrollable. As a result, a yield of a chip including the damaged gate dielectric 346 would be reduced. Signal line 355 is similar to signal line 155 described above and may be formed in one or more metal layers having interconnecting vias.

Figure 4A:
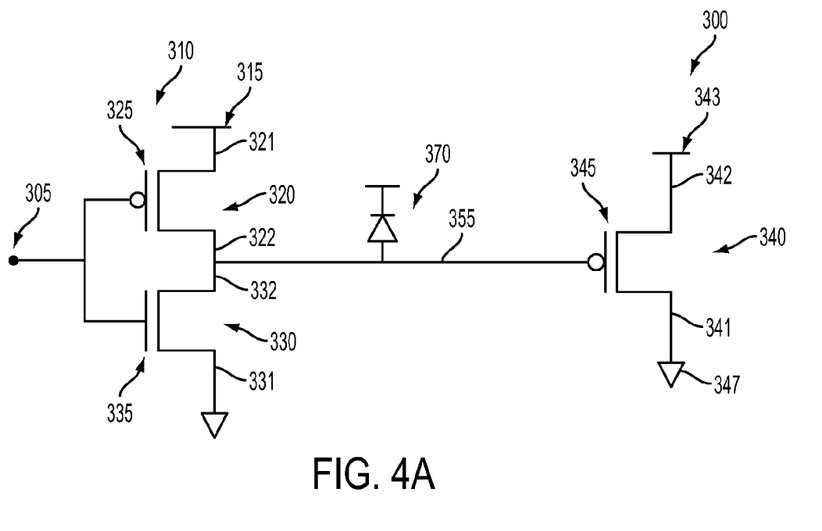
FIG. 4A is a circuit diagram of an inverter and a PMOS transistor connected to a p-type diode, in accordance with some embodiments.

FIG. 4A is a circuit diagram 300' similar to circuit diagram 300 having an addition of a diode 370, in accordance with some embodiments. Diode 370 is placed between the PMOS transistor 140 and the NMOS transistor 130. In some embodiments, diode 370 is a reverse-biased protection diode. Diode 370 is used to drain the positive ions 351 discharged from drain 332, which could damage gate dielectric 346. Diode 370 is also connected to signal line 355. A breakdown voltage of diode 370 is lower than a breakdown voltage or tunneling voltage of gate dielectric 346. Due to the smaller breakdown voltage of diode 370, the gate dielectric 346 is protected.

Figure 4B:
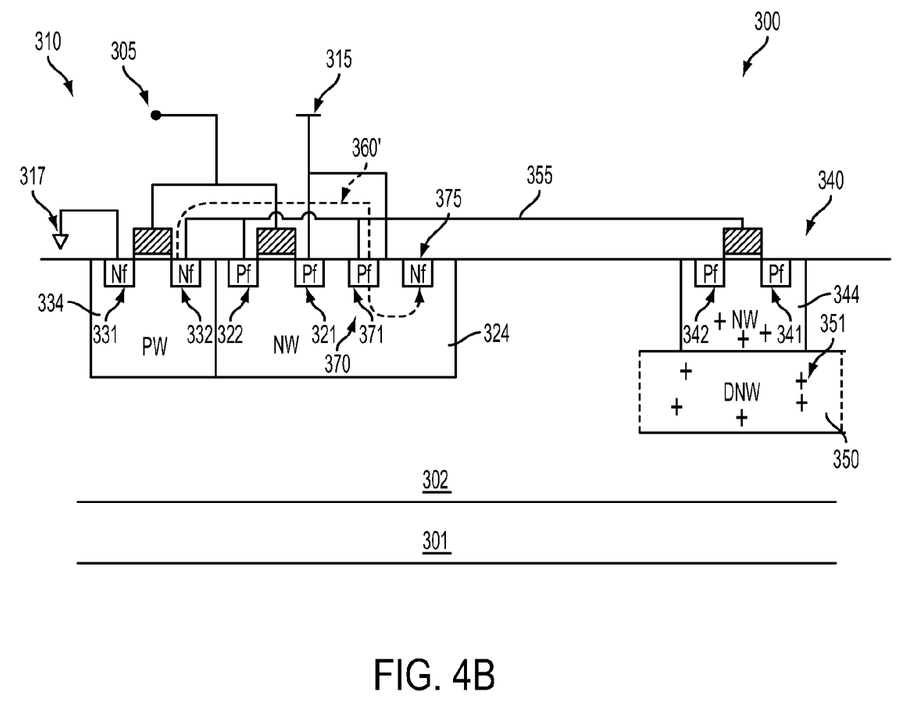
FIG. 4B is a cross-sectional view of a device portion of an inverter, a PMOS transistor, and a p-type diode, in accordance with some embodiments.

FIG. 4B is a cross-sectional view of device structures of inverter 310, PMOS transistor 340 and diode 370, in accordance with some embodiments. Diode 370 includes a p-doped region 371, which is formed in an n-well 324 in accordance with some embodiments. Ions from drain 332 are attracted by the positive ions 351, are drained through diode 370 before reaching gate dielectric 346. The drained ions can be discharged through n-well (or NW) pickup 375. A flow 360' illustrates a path taken by the drained ions attracted by positive ions 351 in DNW 350. Similar to signal line 155, signal line 355 can be formed at various combinations of metal levels. In some embodiments, the highest metal level of the signal line 355 is M3 (or third metal level).

The p-doped region 371 of diode 370 is formed in the NW 324. However diode 370 may also be formed in NW 344 of transistor 340, as long as the drained ions from drain 332 are discharged through diode 370 before reaching gate dielectric 346 of gate structure 345.

Figure 5A:
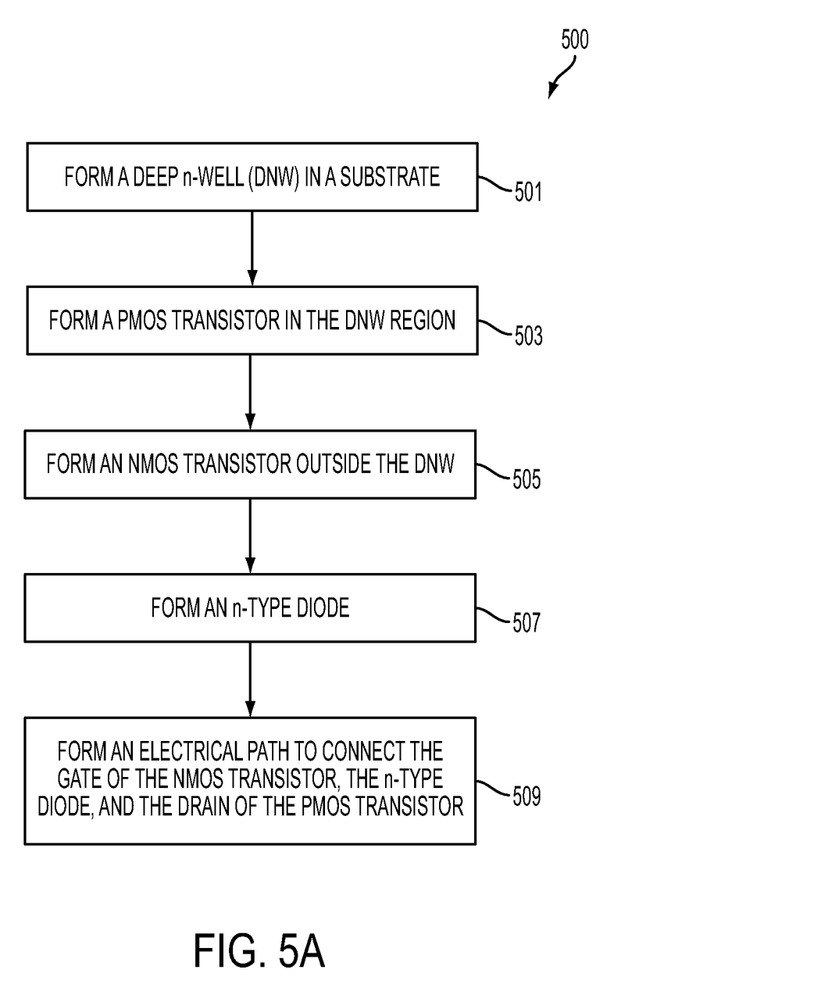
FIGS. 5A and 5B are process flows diagrams for preparing device structures, in accordance with some embodiments.

FIG. 5A is a process flow 500 to form a structure, in accordance with some embodiments. Although illustrated and described in a particular order, the operations may be performed in any logical order. In operation 501, a deep n-well (DNW) is formed in a substrate. The substrate includes a p-doped region. In some embodiments, the DNW is formed in the doped region. At operation 503, a PMOS transistor is formed in the DNW region. At operation 505, an NMOS is formed outside the DNW. At operation 507, an n-type reverse-biased diode is formed. In some embodiments, the n-type diode is located between the PMOS and NMOS transistors. At operation 509, an electrical path is formed to connect a gate of the NMOS, the n-type reverse-biased diode, and a drain of the PMOS transistor in the DNW. Along the electrical path, the n-type reverse-biased diode is between the NMOS and the PMOS in the DNW. The gate of the NMOS transistor and the n-type reverse-biased diode are connected at the same metal level or at a lower level than the metal level connecting these two structures with the drain of the PMOS transistor. Process flow 500 may also include forming a p-doped substrate pickup for discharging positive charges drained by the diode.

Figure 5B:
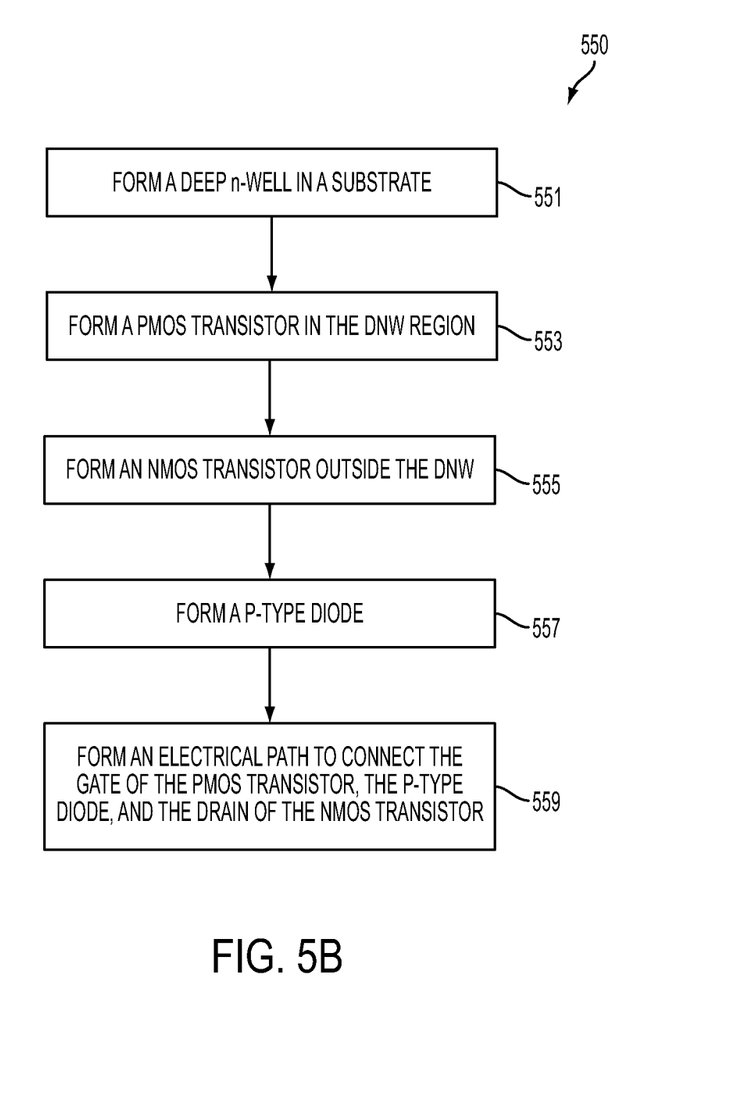

FIG. 5B is a process flow 550 to form a structure, in accordance with some embodiments. Although illustrated and described in particular order, the operations may be performed in any logical order. In operation 551, a deep n-well (DNW) is formed in a substrate. The substrate includes a p-doped region. In some embodiments, the DNW is formed in the doped region. At operation 553, a PMOS transistor is formed in the DNW region. At operation 555, an NMOS is formed outside of the DNW. At operation 557, a p-type reverse-biased diode is formed. At operation 559, an electrical path is formed to connect a gate of the PMOS transistor in the DNW, the P-type reverse-biased diode, and a drain of the NMOS transistor. Along the electrical path, the P-type reverse-biased diode is between the NMOS and the PMOS in the DNW. Process flow 550 also includes forming a p-doped substrate pickup for discharging positive charges drained by the diode.

In some embodiments, N+ active regions (or source and drain regions) and P+ active regions have a respective dopant impurity concentration of above about, for example, $10^{19}/cm^3$. The NW and PW have a respective dopant impurity concentration of, for example, about $10^{16}/cm^3$ to about $10^{17}/cm^3$, in accordance with some embodiments. The DNW has a dopant impurity concentration of, for example, about $10^{15}/cm^3$ to about $10^{16}/cm^3$. One skilled in the art will recognize, however, that these dopant impurity concentrations depend upon the specific device type, technology generation, minimum feature size, and the like. It is intended, therefore, that terms relating to dopant concentrations be interpreted in light of the technology being evaluated and not be limited to the described embodiments.

Although a diode is used to discharge positive or negative charges that are caused by or attracted to the charges in the DNW, other discharge devices may also be used.

During various processing operations, ions from process plasma may be transferred to a deep n-well (DNW) formed under devices structures. A reverse-biased diode may be connected to a signal line to protect a gate dielectric formed outside the DNW and is connected to a drain of the transistor formed inside the DNW.

One aspect of this description relates to a method for forming an integrated circuit. The method includes forming a deep n-well (DNW) in a substrate, and forming a PMOS transistor in the DNW. The method also includes forming an NMOS transistor in the substrate and outside the DNW, and forming a reverse-biased diode. The method further includes forming an electrical path between a drain of the PMOS transistor and a gate structure of the NMOS transistor. The dissipation device is also connected to the electrical path.

Another aspect of this description relates to a method of forming an integrated circuit (IC) structure. The method includes forming a deep n-well (DNW) in a substrate. The method further includes forming a p-channel metal-oxide-semiconductor (PMOS) transistor inside the DNW. The method further includes forming a first n-channel metal-oxide-semiconductor (NMOS) transistor formed in the substrate and outside the DNW. The method further includes forming a dissipation device in the substrate, wherein the dissipation device is connected to a substrate pickup. The method further includes forming an electrical path between a gate structure of the PMOS transistor and a drain of the first NMOS transistor, wherein the dissipation device is connected to the electrical path.

Still another aspect of this description relates to a method of forming an integrated circuit (IC) structure. The method includes forming a deep n-well (DNW) in a substrate. The method further includes forming a first metal-oxide-semiconductor (MOS) transistor of a first conductivity type in the substrate. The method further includes forming a second MOS transistor in the substrate, wherein the second MOS transistor is in an n-well in the substrate. The method further includes forming a dissipation device in the n-well. The method further includes forming an electrical path between a drain of the second MOS transistor and a gate structure of the first MOS transistor, wherein the dissipation device is connected to the electrical path.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming an integrated circuit structure, the method comprising:
    forming a deep n-well (DNW) in a substrate;
    forming a PMOS transistor in the DNW;
    forming an NMOS transistor in the substrate and outside the DNW;
    forming a dissipation device, wherein the dissipation device comprises a reverse-biased diode in the substrate between the PMOS transistor and the NMOS transistor;
    forming a substrate pickup, wherein the dissipation device is connected to the substrate pickup; and
    forming an electrical path between a drain of the PMOS transistor and a gate structure of the NMOS transistor, wherein the dissipation device is also connected to the electrical path.

2. The method of claim 1, wherein the dissipation device comprises an n-type diode.

3. The method of claim 1, wherein a breakdown voltage of the dissipation device is lower than a breakdown voltage or a gate tunneling voltage of the NMOS transistor.

4. The method of claim 1, wherein the DNW has accumulated positive charges from plasma processing.

5. The method of claim 1, wherein the dissipation device is connected to the gate structure of the NMOS transistor at a same metal level or at a lower metal level than the connection between the drain of the PMOS transistor and the gate structure of the NMOS transistor on the electrical path.

6. The method of claim 1, wherein forming the dissipation device comprises forming the dissipation device outside the DNW.

7. A method of forming an integrated circuit (IC) structure, the method comprising:
    forming a deep n-well (DNW) in a substrate;
    forming a p-channel metal-oxide-semiconductor (PMOS) transistor inside the DNW;
    forming a first n-channel metal-oxide-semiconductor (NMOS) transistor formed in the substrate and outside the DNW;
    forming a dissipation device in the substrate, wherein the dissipation device is connected to a substrate pickup; and
    forming an electrical path between a gate structure of the PMOS transistor and a drain of the first NMOS transistor, wherein the dissipation device is connected to the electrical path.

8. The method of claim 7, forming a second NMOS transistor inside the DNW.

9. The method of claim 7, wherein forming the dissipation device comprises forming the dissipation device in a p-well, wherein the first NMOS transistor is in the p-well.

10. The method of claim 7, wherein forming the dissipation device comprises forming the dissipation device separate from the DNW and separate from a well associated with the first NMOS transistor.

11. The method of claim 7, wherein forming the dissipation device comprises forming an n-doped region in the substrate.

12. The method of claim 7, further comprising forming the substrate pickup on an opposite side of the first NMOS transistor from the PMOS transistor.

13. The method of claim 7, wherein forming the electrical path between the gate structure of the PMOS transistor and the drain of the first NMOS transistor comprises forming the electrical path on a plurality of metal levels of the IC structure.

14. The method of claim 7, wherein forming the DNW comprises accumulating ions from at least one plasma process in the DNW.

15. A method of forming an integrated circuit (IC) structure, the method comprising:
    forming a deep n-well (DNW) in a substrate;
    forming a first metal-oxide-semiconductor (MOS) transistor of a first conductivity type in the substrate;
    forming a second MOS transistor in the substrate, wherein the second MOS transistor is in an n-well in the substrate;
    forming a dissipation device in the n-well;
    forming a third MOS transistor in the substrate, wherein the third MOS transistor has a second conductivity type, and the second conductivity type is opposite to the first conductivity type; and
    forming an electrical path between a drain of the second MOS transistor and a gate structure of the first MOS transistor, wherein the dissipation device is connected to the electrical path.

16. The method of claim 15, further comprising forming a substrate pickup in the n-well, wherein the dissipation device is electrically connected to the substrate pickup.

17. The method of claim 16, wherein forming the substrate pickup comprises forming the substrate pickup on an opposite side of the dissipation device from the second MOS transistor.

18. The method of claim 15, wherein forming the electrical path between the drain of the second MOS transistor and the gate structure of the first MOS transistor comprises forming the electrical path on a plurality of metal levels of the IC structure.

19. The method of claim 15, wherein forming the first MOS transistor comprises forming the first MOS transistor in the DNW.

* * * * *